(12) United States Patent
Kashio et al.

(10) Patent No.: US 8,026,332 B2
(45) Date of Patent: Sep. 27, 2011

(54) SEALING MATERIAL FOR OPTICAL ELEMENT AND SEALED OPTICAL ELEMENT

(75) Inventors: Mikihiro Kashio, Tokyo (JP); Toshio Sugizaki, Tokyo (JP); Osamu Moriya, Yokosuka (JP)

(73) Assignee: Lintec Corporation, Tokyo (JP)

( * ) Notice: Subject to any disclaimer, the term of this patent is extended or adjusted under 35 U.S.C. 154(b) by 114 days.

(21) Appl. No.: 12/076,415

(22) Filed: Mar. 18, 2008

(65) Prior Publication Data

US 2008/0249278 A1    Oct. 9, 2008

(30) Foreign Application Priority Data

Mar. 28, 2007   (JP) ................................ 2007-084422

(51) Int. Cl.
*C08G 77/00* (2006.01)
(52) U.S. Cl. .......................................... 528/39; 528/10
(58) Field of Classification Search ...................... 528/39
See application file for complete search history.

(56) References Cited

U.S. PATENT DOCUMENTS

2003/0212228 A1* 11/2003 Dai et al. ........................ 528/10

FOREIGN PATENT DOCUMENTS

| JP | 2004-359933 A | | 12/2004 |
| JP | 2005-263869 A | | 9/2005 |
| JP | 2006-328231 | * | 7/2006 |
| JP | 2006-328231 A | | 12/2006 |

* cited by examiner

*Primary Examiner* — Ling Choi
*Assistant Examiner* — Chun-Cheng Wang
(74) *Attorney, Agent, or Firm* — Birch, Stewart, Kolasch & Birch, LLP

(57) ABSTRACT

A sealing material for optical elements with excellent transparency, crack resistance, and heat resistance which can produce a cured product of the sealing material and a sealed optical element are provided. The sealing material for optical elements comprising a compound with a ladder structure, which contains a repeating unit of the following formula (A) in the molecule as a major component, the compound being obtained by condensing a compound (1) shown by the formula, $R^1Si(OR^3)_p(X^1)_{3-p}$, and a compound (2) shown by the formula, $R^2Si(OR^4)_q(X^2)_{3-q}$, at a molar ratio of 1:9 to 10:0 in the presence of a phosphoric acid catalyst, (A)

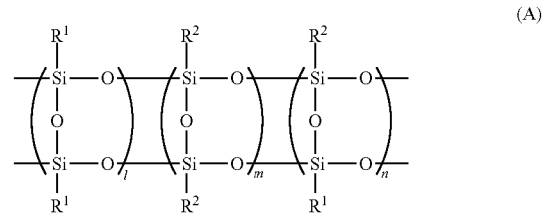

wherein $R^1$ represents a group having a reactive functional group, $R^2$ represents an alkyl group having 1 to 20 carbon atoms, $R^3$ and $R^4$ individually represents an alkyl group having 1 to 6 carbon atoms, $X^1$ and $X^2$ individually indicate a halogen atom, p and q individually represent an integer from 0 to 3, and l, m, and n individually represent 0 or an arbitrary integer, provided that l and n are not 0 at the same time.

6 Claims, 4 Drawing Sheets

(a)

(b)

(c)

(d)

(a)

(b)

(a)

(b)

SEALING MATERIAL FOR OPTICAL ELEMENT AND SEALED OPTICAL ELEMENT

BACKGROUND OF THE INVENTION

1. Field of the Invention

The present invention relates to a sealing material for optical elements capable of producing cured products which is excellent in transparency, crack resistance, and heat resistance, comprising a polysilsesquioxane compound as a major component, and to a sealed optical element comprising an optical element sealed by the cured product of the sealing material.

2. Description of Related Art

There are various types of optical elements including various lasers such as a semiconductor laser, light emitting devices such as a light emitting diode (LED), a photo acceptance unit, a composite light element, an optical integrated circuit, and the like. In recent years, an optical element of a blue light or a white light of which the peak wavelength of luminescence is short has been developed and is widely used. A rapid increase in brightness of light emitting devices with a short peak wavelength of luminescence tends to accompany an increase of the calorific power of the optical element.

An optical element is usually used as a sealed optical element in which the optical element is sealed with a cured product of a sealing material.

In general, a composition containing a transparent epoxy resin as a major component which can produce a cured product with excellent heat resistance and the like has been known as the sealing material for optical elements.

However, along with the increase in the brightness of optical elements in recent years, the cured products of the optical element sealing material are exposed to a high energy light and a high temperature generated by the optical elements, causing deterioration, which results in cracking and yellowing (coloration) of the cured products. Cracks produced in the cured sealing material make the optical elements unusable. The coloration reduces transparency and lowers the brightness of the optical elements.

In order to solve these problems, sealing materials for optical elements using a polysilsesquioxane compound as a major component have been proposed in Patent Documents 1 to 3. The polysilsesquioxane compounds disclosed in the Patent Documents 1 to 3 are claimed to produce a sealed optical element excelling in crack resistance and heat resistance.

However, it is sometimes difficult for the cured sealing materials for optical elements containing the polysilsesquioxane compounds disclosed in the Patent Documents 1 to 3 to sufficiently prevent yellowing and cracking when exposed to a high energy light or a high temperature generated by the optical elements. Therefore, development of a sealing material for optical elements which can produce a cured product exhibiting more excellent crack resistance and heat resistance has been desired.

[Patent Document 1] JP-A-2004-359933
[Patent Document 2] JP-A-2005-263869
[Patent Document 3] JP-A-2006-328231

The present invention has been achieved in view of this situation in commonly used technology and has an object of providing a sealing material for optical elements capable of producing a cured product which is excellent in crack resistance and heat resistance and is free from coloration or deterioration when exposed to high energy or a high temperature, and a sealed optical element comprising an optical element sealed by the cured product of such a sealing material.

SUMMARY OF THE INVENTION

As a result of extensive studies in order to achieve the above object, the inventors of the present invention have found that a cured product of a sealing material for optical elements containing a polysilsesquioxane compound with a ladder structure obtained by condensing a specific alkoxysilane compound in the presence of a phosphoric acid catalyst as a major component has outstanding transparency, crack resistance, and heat resistance. This finding has led to the completion of the present invention.

Specifically, according to a first aspect of the present invention, sealing materials for optical elements (1) to (4) below are provided.

(1) A sealing material for optical elements comprising a polysilsesquioxane compound with a ladder structure, which contains a repeating unit of the following formula (A) in the molecule as a major component, the polysilsesquioxane compound being obtained by condensing a silane compound (1) of the following formula (1) and a silane compound (2) of the following formula (2) at a molar ratio of 5:95 to 100:0 in the presence of a phosphoric acid catalyst.

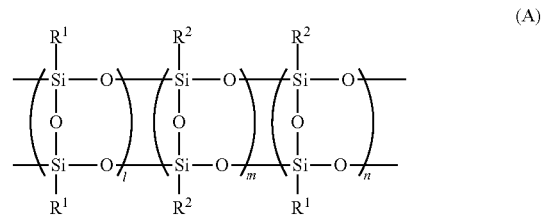

wherein $R^1$ represents a group having a reactive functional group, $R^2$ represents an alkyl group having 1 to 20 carbon atoms or a phenyl group which may have a substituent, and l, m, and n individually represent 0 or an arbitrary integer, provided that l and n are not 0 at the same time.

wherein $R^1$ has the same meaning as above, $R^3$ represents an alkyl group having 1 to 6 carbon atoms, $X^1$ represents a halogen atom, and p is an integer from 0 to 3,

wherein $R^2$ has the same meaning as above, $R^4$ represents an alkyl group having 1 to 6 carbon atoms, $X^2$ represents a halogen atom, and q is an integer from 0 to 3.

(2) The sealing material for optical elements according to (1), wherein $R^1$ in the formula (A) representing the polysilsesquioxane compound is a group having a reactive cyclic ether group, an alkenyl group, a methacryloyl group, an acryloyl group, or a mercapto group.

(3) The sealing material for optical elements according to (1) or (2), wherein the phosphoric acid catalyst is a compound shown by the following formula (3),

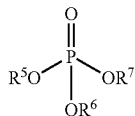
(3)

wherein R⁵, R⁶, and R⁷ individually represent a hydrogen atom, an alkyl group having 1 to 8 carbon atoms, or a phenyl group which may have a substituent, provided that at least one of R⁵, R⁶, and R⁷ is a hydrogen atom.
(4) The sealing material for optical elements according to (1) or (2), wherein the phosphoric acid catalyst is a compound shown by the following formula (4),

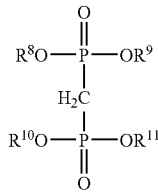
(4)

wherein R⁸, R⁹, R¹⁰, and R¹¹ individually represent a hydrogen atom, an alkyl group having 1 to 8 carbon atoms, or a phenyl group which may have a substituent, provided that at least one of R⁸, R⁹, R¹⁰, and R¹¹ is a hydrogen atom.
(5) The sealing material for optical elements according to any one of (1) or (4), wherein the polysilsesquioxane compound is a compound having a weight average molecular weight of 1,000 to 5,000.

According to a second aspect of the present invention, a sealed optical element described in (6) below is provided.
(6) A sealed optical element in which an optical element is sealed with a cured product of the sealing material according to any one of the above (1) to (5).

The sealing material for optical elements of the present invention can provide a cured product excelling in transparency, crack resistance, and heat resistance. The cured product is free from deterioration which results in cracking or coloration which impairs transparency when exposed to higher energy light or a high temperature, even when the sealed optical element emits luminescence with a short wavelength and high brightness.

Since the sealed optical element of the present invention is sealed with the sealing material for optical elements of the present invention, the sealed optical element excels in durability and heat resistance.

DETAILED DESCRIPTION OF THE INVENTION AND PREFERRED EMBODIMENTS

The present invention will be described in detail below.
1) Sealing Material for Optical Elements The sealing material for optical elements of the present invention comprises a polysilsesquioxane compound with a ladder structure, which contains a repeating unit of the above formula (A) in the molecule (hereinafter referred to from time to time as "polysilsesquioxane compound (A)"), as a major component, the polysilsesquioxane compound being obtained by condensing a silane compound (1) of the formula (1), $R^1Si(OR^3)_p(X^1)_{3-p}$, and a silane compound (2) of the formula (2), $R^2Si(OR^4)_q(X^2)_{3-q}$, at a molar ratio of 5:95 to 100:0 in the presence of a phosphoric acid catalyst.

In the sealing material for optical elements of the present invention, "comprising polysilsesquioxane compound (A) as a major component" means that the sealing material for optical elements contains one or more polysilsesquioxane compounds (A) and may further contain other additive components described later, to the extent that the object of the present invention is not inhibited. The amount of the polysilsesquioxane compound (A) in the sealing material for optical elements of the present invention is usually 70 wt % or more, preferably 80 wt % or more, and more preferably 90 wt % or more of the total of the sealing material for optical elements.
(1) Silane Compound (1)

In the silane compound (1) used in the present invention, $R^1$ in the formula (1) is a group having a reactive functional group.

As examples of the group having a reactive functional group represented by $R^1$, groups shown by —Y—Z (wherein Y is a divalent linking group and Z shows a reactive functional group) can be given.

Examples of Y which can be given are a single bond, —O—, a group shown by $-(CHr^1)_a-$, wherein a is an integer of 1 to 10 and $r^1$ represents a hydrogen atom or an alkyl group having 1 to 6 carbon atoms, when a is two or more, the two or more groups shown by $-(CHr^1)-$ may be the same or different, a group shown by $-O-(CHr^2)_b-$, wherein b is an integer of 1 to 10 and $r^2$ represents a hydrogen atom or an alkyl group having 1 to 6 carbon atoms, when b is two or more, the two or more groups shown by $-(CHr^2)-$ may be the same or different, a group shown by $-(CH_2CH_2O)_c-$, wherein c is an integer of 1 to 10, and a divalent hydrocarbon group such as an arylene group, e.g., a p-phenylene group, an m-phenylene group, or a 1,4-naphthalene group.

There are no specific limitations to the group shown by Z. Z may be any group that enables a cross-linking reaction in the reactive functional group area to proceed by heating the compound shown by the formula (A), thereby producing a cured product of the compound shown by the formula (A).

As specific examples of Z, reactive cyclic ether groups such as an epoxy group (oxiranyl group), a 3,4-epoxycyclohexyl group, an oxetanyl group, a tetrahydrofuryl group, and a tetrahydropyranyl group; alkenyl groups such as a vinyl group; methacryloyl groups; acryloyl groups; mercapto groups; hydroxyl groups; amide groups; isocyanate groups; carboxyl groups; and alkoxyl groups such as a methoxy group and an ethoxy group can be given.

Among these, from the viewpoint of easy availability and capability of producing a cured product with excellent transparency, crack resistance, heat resistance, and the like, a reactive cyclic ether group, an alkenyl group, a methacryloyl group, an acryloyl group, and a mercapto group are preferable, with a reactive cyclic ether group, a methacryloyl group, and an acryloyl group being more preferable.

As particularly preferable examples of the group —Y—Z for $R^1$, a glycidyl group, a 2-oxiranylethyl group, a 3-oxiranylpropyl group, a 4-oxiranylbutyl group, a glycidoxy group, a 2-glycidoxyethyl group, a 3-glycidoxypropyl group, a 4-glycidoxybutyl group, a 2-(3,4-epoxycyclohexyl)ethyl group, and a 2-[2-(3,4-epoxycyclohexylmethoxy)ethoxy]ethyl group can be given.

$R^3$ in the above formula (1) represents an alkyl group having 1 to 6 carbon atoms. As examples of the alkyl group having 1 to 6 carbon atoms, a methyl group, an ethyl group, an n-propyl group, an isopropyl group, an n-butyl group, a sec-butyl group, an isobutyl group, a t-butyl group, an n-pentyl, and an n-hexyl group can be given. Among these alkyl groups, a methyl group and an ethyl group are preferable from the viewpoint of economy, ease of handling, and the like.

$X^1$ represents a halogen atom such as a fluorine atom, a chlorine atom, or a bromine atom.

In addition, p is an integer from 0 to 3. When p is two or more, the two or more $OR^3$ groups may be the same or different, and when (3-p) is two or more, the two or more $X^1$ may be either the same or different.

As specific examples of the silane compound (1), trialkoxysilane compounds such as glycidyltrimethoxysilane, glycidyltriethoxysilane, glycidyltripropoxysilane, glycidyltributoxysilane, 3-glycidoxypropyltrimethoxysilane, 3-glycidoxypropyltriethoxysilane, 3-glycidoxypropyltripropoxysilane, 3-glycidoxypropyltributoxysilane, 2-(3,4-epoxycyclohexyl)ethyltrimethoxysilane, 2-(3,4-epoxycyclohexyl)ethyltriethoxysilane, 2-(3,4-epoxycyclohexyl)ethyltripropoxysilane, 2-(3,4-epoxycyclohexyl)ethyltributoxysilane, 3-acryloxypropyltrimethoxysilane, 3-acryloxypropyltriethoxysilane, 3-acryloxypropyltripropoxysilane, 3-acryloxypropyltributoxysilane, 3-methacryloxypropyltrimethoxysilane, 3-methacryloxypropyltriethoxysilane, 3-methacryloxypropyltripropoxysilane, 3-methacryloxypropyltributoxysilane, vinyltrimethoxysilane, vinyltriethoxysilane, vinyltripropoxysilane, vinyltributoxysilane, 3-mercaptopropyltrimethoxysilane, 3-mercaptopropyltriethoxysilane, 3-mercaptopropyltripropoxysilane, and 3-mercaptopropyltributoxysilane; halogenosilane compounds such as glycidyltrichlorosilane, glycidylchlorodimethoxysilane, glycidyldichloromethoxysilane, glycidylchlorodiethoxysilane, glycidyldichloroethoxysilane, glycidyltribromosilane, 3-glycidoxypropyltrichlorosilane, 3-glycidoxypropylchlorodimethoxysilane, 3-glycidoxypropyldichloromethoxysilane, 3-glycidoxypropylchlorodiethoxysilane, 3-glycidoxypropyldichloroethoxysilane, 3-glycidoxypropyltribromosilane, 3-methacryloxypropyltrichlorosilane, 3-methacryloxypropylchlorodimethoxysilane, 3-methacryloxypropyldichloromethoxysilane, 3-methacryloxypropylchlorodiethoxysilane, 3-methacryloxypropyldichloroethoxysilane, 3-methacryloxypropyltribromosilane, 3-mercaptopropyltrichlorosilane, 3-mercaptopropylchlorodimethoxysilane, 3-mercaptopropyldichloromethoxysilane, 3-mercaptopropylchlorodiethoxysilane, 3-mercaptopropyldichloroethoxysilane, 3-mercaptopropyltribromosilane, and the like can be given. These silane compounds may be used either individually or in combination of two or more.

(2) Silane Compound (2)

In the silane compound (2), $R^2$ in the above formula (2) represents an alkyl group having 1 to 20 carbon atoms or a phenyl group which may have a substituent.

Given as examples of the alkyl groups having 1 to 20 carbon atoms are a methyl group, an ethyl group, an n-propyl group, an isopropyl group, an n-butyl group, a sec-butyl group, an isobutyl group, a t-butyl group, an n-pentyl group, an n-hexyl group, an n-heptyl group, an n-octyl group, an isooctyl group, an n-nonyl group, an n-decyl group, and an n-dodecyl group.

As examples of the substituent for the phenyl group which may have a substituent, alkyl groups such as a methyl group, an ethyl group, an n-propyl group, an isopropyl group, an n-butyl group, a sec-butyl group, an isobutyl group, a t-butyl group, an n-pentyl group, an n-hexyl group, an n-heptyl group, an n-octyl group, and an isooctyl group; halogen atoms such as a fluorine atom, a chlorine atom, and a bromine atom; and alkoxy groups such as a methoxy group and an ethoxy group can be given.

Specific examples of the phenyl group which may have a substituent include a phenyl group, a 4-methylphenyl group, a 4-chlorophenyl group, and a 4-chloromethylphenyl group.

$R^4$ represents the same alkyl groups having 1 to 6 carbon atoms as $R^2$, and $X^2$ represents the same halogen atoms as $X^1$.

q represents an integer from 0 to 3. When q is 2 or more, the two or more groups represented by $OR^4$ may be either the same or different, and when (3-q) is 2 or more, the two or more $X^2$s may be either the same or different.

As specific examples of the silane compound (2), substituted or unsubstituted phenyl silane compounds such as phenyltrimethoxysilane, 4-chlorophenyltrimethoxysilane, phenyltriethoxysilane, 2-methoxyphenyltriethoxysilane, phenyldimethoxyethoxysilane, and phenyldiethoxymethoxysilane; alkylsilane compounds such as methyltrimethoxysilane, methyltriethoxysilane, ethyltrimethoxysilane, ethyltriethoxysilane, n-propyltrimethoxysilane, n-butyltriethoxysilane, isobutyltrimethoxysilane, n-pentyltriethoxysilane, n-hexyltrimethoxysilane, isooctyltriethoxysilane, dodecyltrimethoxysilane, methyldimethoxyethoxysilane, and methyldiethoxymethoxysilane;

substituted or unsubstituted phenylhalogenosilanes such as phenyltrichlorosilane, phenylchlorodimethoxysilane, phenyldichloromethoxysilane, phenyltribromosilane, phenylchloromethoxyethoxysilane, 4-chlorophenyltrichlorosilane, phenyltrichlorosilane, and 2-methoxyphenyltrichlorosilane; and alkylhalogenosilanes such as methyltrichlorosilane, methylchlorodimethoxysilane, methyldichloromethoxysilane, methyltribromosilane, methylchlorodiethoxysilane, ethyltrichlorosilane, ethylchlorodimethoxysilane, ethyldichloromethoxysilane, ethyltribromosilane, n-propyltrichlorosilane, n-propylchlorodimethoxysilane, and n-propyldichloromethoxysilane can be given. These silane compounds may be used either individually or in combination of two or more.

The molar ratio of the silane compound (1) to the silane compound (2) can be arbitrary determined from a range of 5:95 to 100:0, but preferably is 10:90 to 70:30, and more preferably 25:75 to 50:50. A polysilsesquioxane compound which can produce a cured product with excellent crack resistance and heat resistance can be obtained by using the silane compound (1) and silane compound (2) at a ratio of the above ranges.

(3) Phosphoric Acid Catalyst

A phosphoric acid catalyst is used for the condensation reaction of the silane compound (1) and the silane compound (2) in the present invention. A polysilsesquioxane compound which can produce a cured product with excellent crack resistance and heat resistance can be obtained by using a phosphoric acid catalyst.

There are no specific limitations to the type of the phosphoric acid catalyst insofar as the catalyst is a phosphorus compound having a dissociable hydrogen atom. For example, monovalent phosphoric acid compounds such as hypophosphorous acid; trivalent phosphoric acid compounds such as metaphosphorous acid, pyrophosphorous acid, and orthophosphorous acid; tetravalent phosphoric acid compounds such as hypophosphoric acid; and pentavalent phosphoric acid compounds can be given. These phosphoric acid catalysts may be used either individually or in combination of two or more.

Among these, pentavalent phosphoric acid compounds shown by the following formula (3) or (4) are preferable.

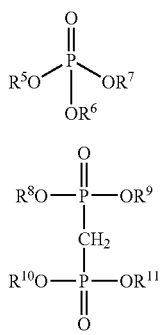

(3)

(4)

In the formula (3), $R^5$, $R^6$, and $R^7$ individually represent a hydrogen atom, an alkyl group having 1 to 8 carbon atoms, or a phenyl group which may have a substituent, provided that at least one of $R^5$, $R^6$, and $R^7$ is a hydrogen atom. In the formula (4), $R^8$, $R^9$, $R^{10}$, and $R^{11}$ individually represent a hydrogen atom, an alkyl group having 1 to 8 carbon atoms, or a phenyl group which may have a substituent, provided that at least one of $R^8$, $R^9$, $R^{10}$, and $R^{11}$ is a hydrogen atom.

As examples of the alkyl group having 1 to 8 carbon atoms represented by $R^5$ to $R^{11}$, a methyl group, an ethyl group, an n-propyl group, an isopropyl group, an n-butyl group, a sec-butyl group, an isobutyl group, a t-butyl group, an n-pentyl group, an n-hexyl group, and an n-heptyl group can be given. As examples of the phenyl group which may have a substituent, the same groups as previously given as examples for the group $R^2$ can be given.

As examples of the pentavalent phosphoric acid compound shown by the formula (3), orthophosphoric acid, metaphosphoric acid, polyphosphoric acid, methylphosphoric acid, ethylphosphoric acid, propylphosphoric acid, phenylphosphoric acid, dimethylphosphoric acid, diethylphosphoric acid, dipropylphosphoric acid, diphenylphosphoric acid, and phenylmethylphosphoric acid can be given. As specific examples of the pentavalent phosphoric acid compound shown by the formula (4), methylenediphosphone acid and the like can be given.

The amount of the phosphoric acid catalyst used is usually 0.1 to 10 mol %, and preferably 1 to 5 mol % of the mol of the silane compound (1), or the total mol of the silane compound (1) and silane compound (2) (hereinafter referred to simply as "silane compounds" from time to time).

There are no limitations to the method for obtaining a polysilsesquioxane compound by condensation of the silane compound in the presence of the phosphoric acid catalyst. For example, a method of adding the phosphoric acid catalyst to a solution of the silane compounds and stirring the mixture can be given.

As examples of the solvent used for the reaction, water; aromatic hydrocarbons such as benzene, toluene, and xylene; esters such as methyl acetate, ethyl acetate, propyl acetate, and methyl propionate; ketones such as acetone, methyl ethyl ketone, methyl isobutyl ketone, and cyclohexanone; alcohols such as methyl alcohol, ethyl alcohol, n-propyl alcohol, isopropyl alcohol, n-butyl alcohol, isobutyl alcohol, sec-butyl alcohol, and t-butyl alcohol; and the like can be given. The solvents may be used either individually or in combination of two or more.

Of these, water, aromatic hydrocarbons, and a mixture of these are preferable, with a particularly preferable solvent being a mixture of water and toluene.

The solvent is used in an amount of 1 l for usually 0.1 to 10 mol, and preferably 0.5 to 10 mol of the silane compounds.

The condensation reaction temperature of the silane compounds is usually in the range from 0° C. to the boiling point of the solvent used, and preferably in the range of 20° C. to 100° C. If the temperature is too low, the condensation reaction proceeds only insufficiently. On the other hand, if the temperature is too high, inhibition of gel production is difficult. The reaction time is usually from 30 minutes to 20 hours.

The reaction is terminated by adding an aqueous solution of an alkali such as sodium hydrogencarbonate. A salt produced when the alkali is added is removed by filtration, washing, or the like to obtain the target polysilsesquioxane compound (A).

(4) Polysilsesquioxane Compound (A)

The resulting polysilsesquioxane compound (A) has a ladder structure having the repeating unit shown by the above formula (A).

In the formula (A), l, m, and n individually represent 0 or an arbitrary positive integer, provided that l and n are not 0 at the same time.

The repeating unit of the polysilsesquioxane compound (A) is shown by any one of the following formulas (a) to (c), provided that the repeating unit shown by the formula (a) and/or the repeating unit shown by the formula (c) are essential.

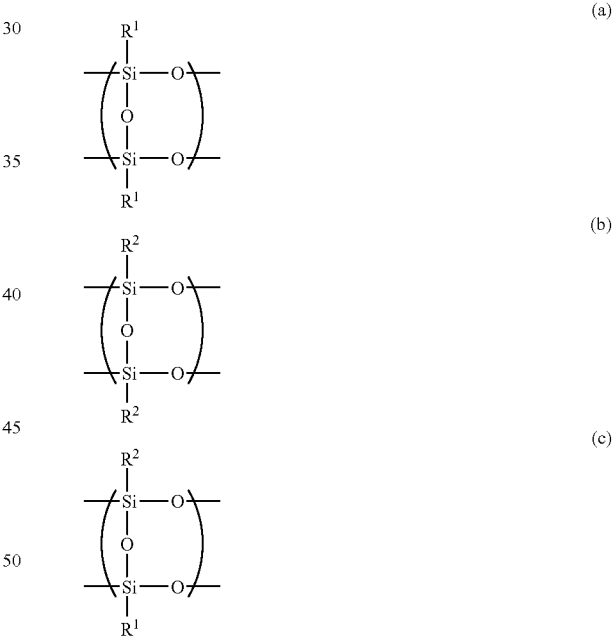

wherein $R^1$ and $R^2$ have the same meanings as defined above.

That is, the resulting polysilsesquioxane compound (A) may be a homopolymer consisting of only one type of the repeating unit shown by the formula (a), a copolymer consisting of two or more types of the repeating unit shown by the formula (a), or a copolymer consisting of the repeating units shown by the formulas (a) to (c). The repeating unit shown by the formula (c) may bond in the (co)polymer in the inverted form (upside down).

When the resulting polysilsesquioxane compound (A) is a copolymer, such a copolymer may be any (co)condensate such as a random (co)polymer, a partial block (co)polymer, or a complete block (co)polymer.

The weight average molecular weight (Mw) of the polysilsesquioxane compound (A) is usually 1,000 to 5,000, and preferably 1,500 to 4,000. The weight average molecular weight can be determined as a polystyrene-reduced value by gel permeation chromatography (GPC) using tetrahydrofuran (THF) as a solvent, for example.

The resulting polysilsesquioxane compound (A) has a linearly extended ladder structure. Whether or not the reaction product has a ladder structure may be confirmed by measuring the infrared absorption spectrum or X-ray diffraction of the reaction product, for example.

Although the sealing material for optical elements of the present invention may consists only of a polysilsesquioxane compound (A), if the polysilsesquioxane compound (A) is self-crosslinkable (self-curable), the sealing material may be a composition containing other components to the extent that the object of the present invention is not inhibited.

As such other components, an antioxidant, a UV absorber, a photostabilizer, a diluent, a silane coupling agent, and the like can be given.

The antioxidant is added to prevent deterioration due to oxidation during heating.

As examples of the antioxidant, a phenol-based antioxidant, a sulfur-containing antioxidant, a phosphorus-containing antioxidant, and the like can be given.

As specific examples of the phenol-based antioxidant, monophenols such as 2,6-di-t-butyl-p-cresol, dibutylhydroxytoluene, butylated hydroxyanisole, 2,6-di-t-butyl-p-ethylphenol, and stearyl-β-(3,5-di-t-butyl-4-hydroxyphenyl) propionate; bisphenols such as 2,2'-methylenebis(4-methyl-6-t-butylphenol), 2,2'-methylenebis(4-ethyl-6-t-butylphenol), 4,4'-thiobis(3-methyl-6-t-butylphenol), 4,4'-butylidenebis(3-methyl-6-t-butylphenol), and 3,9-bis[1,1-dimethyl-2-{β-(3-t-butyl-4-hydroxy-5-methylphenyl) propionyloxy}ethyl]-2,4,8,10-tetraoxaspiro[5,5] undecane; and polymer phenols such as 1,1,3-tris(2-methyl-4-hydroxy-5-t-butylphenyl)butane, 1,3,5-trimethyl-2,4,6-tris(3,5-di-t-butyl-4-hydroxybenzyl)benzene, tetrakis[methylene-3-(3',5'-di-t-butyl-4'-hydroxyphenyl)propionate]methane, bis[3,3'-bis-(4'-hydroxy-3'-t-butylphenyl)butylic acid]glycol ester, 1,3,5-tris(3'5'-di-t-butyl-4'-hydroxybenzyl)-S-triazine-2,4,6-(1H,3H,5H)tri-on, and tocopherol can be given.

Examples of the sulfur-containing antioxidant include dilauryl-3,3'-thiodipropionate, dimyristyl-3,3'-thiodipropionate, and distearyl-3,3'-thiodipropionate, and the like.

Examples of the phosphorus-containing antioxidant include phosphite compounds such as triphenylphosphite, diphenylisodecylphosphite, phenyldiisodecylphosphite, tris(nonylphenyl)phosphite, diisodecylpentaerythritolphosphite, tris(2,4-di-t-butylphenyl)phosphite, cyclic neopentan-tetra-yl-bis(octadecyl)phosphite, cyclic neopentan-tetra-yl-bis(2,4-di-t-butylphenyl)phosphite, cyclic neopentan-tetra-yl-bis(2,4-di-t-butyl4-methylphenyl) phosphite, and bis[2-t-butyl-6-methyl-4-{2-(octadecyloxycarbonyl)ethyl}phenyl]hydrogen phosphite; oxaphosphaphenanthrene oxides such as 9,10-dihydro-9-oxa-10-phosphaphenanthrene-10-oxide, 10-(3,5-di-t-butyl-4-hydroxybenzyl)-9,10-dihydro-9-oxa-10-phosphaphenanthrene-10-oxide, and 10-decyloxy-9,10-dihydro-9-oxa-10-phosphaphenanthrene-10-oxide can be given.

These antioxidants may be used either individually or in combination of two or more. The antioxidant is used in an amount of preferably 0.01 to 10 parts by weight per 100 parts by weight of the polysilsesquioxane compound.

A UV absorber is added in order to increase light resistance of the sealing material for optical elements.

As examples of the UV absorber, salicylic acids such as phenyl salicylate, p-t-butylphenyl salicylate, and p-octylphenyl salicylate; benzophenones such as 2,4-dihydroxybenzophenone, 2-hydroxy-4-methoxybenzophenone, 2-hydroxy-4-octoxybenzophenone, 2-hydroxy-4-dodecyloxybenzophenone, 2,2'-dihydroxy-4-methoxybenzophenone, 2,2'-dihydroxy-4,4'-dimethoxybenzophenone, and 2-hydroxy-4-methoxy-5-sulfobenzophenone; benzotriazoles such as 2-(2'-hydroxy-5'-methylphenyl)benzotriazole, 2-(2'-hydroxy-5'-tert-butylphenyl)benzotriazole, 2-(2'-hydroxy-3',5'-ditert-butylphenyl)benzotriazole, 2-(2'-hydroxy-3'-tert-butyl-5'-methylphenyl)-5-chlorobenzotriazole, 2-(2'-hydroxy-3',5'-ditert-butylphenyl)-5-chlorobenzotriazole, 2-(2'-hydroxy-3',5'-ditert-amylphenyl)benzotriazole, and 2-{(2'-hydroxy-3',3",4",5",6"-tetrahydrophthalimidemethyl)-5'-methylphenyl } benzotriazole; and hindered amines such as bis(2,2,6,6-tetramethyl-4-piperidyl)sebacate, bis(1,2,2,6,6-pentamethyl-4-piperidyl)sebacate, and bis(1,2,2,6,6-pentamethyl-4-piperidyl)[{3,5-bis(1,1-dimethylethyl)-4-hydroxyphenyl} methyl]butylmalonate can be given.

These UV absorbers may be used either individually or in combination of two or more. The UV absorbers are used in an amount of preferably 0.01 to 10 parts by weight per 100 parts by weight of the polysilsesquioxane compound.

A photostabilizer is added in order to increase light resistance of the sealing material for optical elements.

As examples of photostabilizers, hindered amines such as poly[{6-(1,1,3,3-tetramethylbutyl)amino-1,3,5-triazine-2,4-diyl} {(2,2,6,6-tetramethyl-4-piperidine)imino}hexamethylene {(2,2,6,6-tetramethyl-4-piperidine)imino}] and the like can be given.

These photostabilizers may be used either individually or in combination of two or more. The photostabilizers are used in an amount of preferably 0.01 to 10 parts by weight per 100 parts by weight of the silsesquioxane compound.

A diluent is added to adjust viscosity of the sealing material for optical elements.

As examples of diluents, glycerol diglycidyl ether, butanediol diglycidyl ether, diglycidyl aniline, neopentyl glycol glycidyl ether, cyclohexanedimethanol diglycidyl ether, alkylene diglycidyl ether, polyglycol diglycidyl ether, polypropylene glycol diglycidyl ether, trimethylolpropane triglycidyl ether, glycerol triglycidyl ether, 4-vinylcyclohexene mono-oxide, vinylcyclohexene dioxide, and methylated vinylcyclohexene dioxide can be given. These diluents may be used either individually or in combination of two or more.

A silane coupling agent is added in order to increase adhesion to the sealing material for optical elements to the optical elements.

As examples of the silane coupling agents, γ-glycidoxypropyltrimethoxysilane, γ-glycidoxypropyltriethoxysilane, β-(3,4-epoxycyclohexyl)ethyltrimethoxysilane, β-(3,4-epoxycyclohexyl)ethyltriethoxysilane, vinyltrimethoxysilane, vinyltriethoxysilane, and the like can be given.

Although the sealing material for optical elements of the present invention contains the polysilsesquioxane compound (A) having a ladder structure as a major component, it may contain polysilsesquioxane compounds having a random structure or a basket structure to the extent that the effect of the present invention is not inhibited.

The sealing material for optical elements of the present invention may further contain a curing agent. As described later, an optical element is sealed with sealing material for optical elements of the present invention by curing the polysilsesquioxane compound (A). The addition of a curing agent may have an effect of ensuring a smoother curing reaction.

The curing agent can be appropriately selected according to the type of reactive functional groups possessed by the polysilsesquioxane compound of the present invention without any specific limitations. For example, a curing agent used for curing a heat-curable resin, a photoinitiator used for crosslinking of a resin crosslinkable with ionizing radiation, and the like can be given.

As the curing agent used for curing the polysilsesquioxane compound having a reactive cyclic ether as a functional group, acid anhydrides, aromatic amines, phenol resins, and the like can be given.

Examples of the acid anhydrides include, but are not limited to, phthalic anhydride, tetrahydrophthalic anhydride, methyltetrahydrophthalic anhydride, methylhexahydrophthalic anhydride, methylnadic anhydride, himic anhydride, succinic anhydride, trimellitic anhydride, pyromellitic anhydride, and YH-306 (manufactured by Japan Epoxy Resins Co., Ltd.).

There are no specific limitations to the type of the aromatic amine compounds insofar as the compounds are amine compounds having an aromatic ring. As examples of commercially-available products, Epicure W and Epicure Z (manufactured by Japan Epoxy Resins Co., Ltd.), Kayahard AA, Kayahard A-B, and Kayahard A-S (manufactured by Nippon Kayaku Co., Ltd.), Totoamine HM-205 (manufactured by Tohto Kasei Co., Ltd.), Adekahardener EH-101 (manufactured by ADEKA Corporation), Epomic Q-640 and Epomic Q-643 (manufactured by Mitsui Chemicals, Inc.), and DETDA80 (manufactured by Lonza) can be given.

As phenol resins, any phenol resins having two or more phenolic hydroxyl groups in the molecule can be used without specific limitations. As examples, a novolak phenol resin obtained by condensation or co-condensation of a phenol such as phenol, cresol, resorcin, catechol, bisphenol A, bisphenol F, phenyl phenol, and aminophenol and/or a naphtol such as α-naphtol, β-naphtol, and dihydroxynaphthalene with a compound having an aldehyde group such as hormaldehyde in the presence of an acid catalyst; a phenol/aralkyl resin synthesized from a phenol and/or a naphtol and dimethoxy paraxylene or bis(methoxymethyl)biphenyl, an aralkyl phenol resin such as a naphtol aralkyl resin, a dicyclopentadiene-modified phenol resin, a cyclopentadiene-modified phenol resin, a terpene-modified phenol resin, a polycyclic aromatic ring-modified phenol resin, a triphenolmethane phenol resin, bisphenol A, bisphenol F, bisphenol S, thiodiphenol, and naphthalenediol can be given.

These phenol resins may be used either individually or in combination of two or more.

Examples of the photopolymerization initiator having a methacryloyl group, an acryloyl group, or an alkenyl group as a functional group which can be used to crosslink the polysilsesquioxane compound include benzoins such as benzoin, benzoin methyl ether, benzoin ethyl ether, benzoin isopropyl ether, benzoin n-butyl ether, and benzoin isobutyl ether; acetophenones such as acetophenone, dimethylaminoacetophenone, 2,2-dimethoxy-2-phenylacetophenone, 2,2-diethoxy-2-phenylacetophenone; ketones such as 2-hydroxy-2-methyl-1-phenylpropan-1-one, 1-hydroxycyclohexyl phenyl ketone, 2-methyl-1-[4-(methylthio)phenyl]-2-morpholino-propan-1-one, and 4-(2-hydroxyethoxy)-phenyl-2-(hydroxyl-2-propyl)ketone; benzophenones such as benzophenone, p-phenylbenzophenone, 4,4'-diethylaminobenzophenone, and dichlorobenzophenone; anthraquinones such as 2-methylanthraquinone, 2-ethylanthraquinone, 2-t-butylanthraquinone, and 2-aminoanthraquinone; thioxanethones such as 2-methylthioxanthone, 2-ethylthioxanethone, 2-chlorothioxanthone, 2,4-dimethylthioxanethone, 2,4-diethylthioxanthone; ketals such as benzyl dimethyl ketal and acetophenone dimethyl ketal; and p-dimethylaminebenzoate.

These photopolymerization initiators may be used either individually or in combination of two or more.

Although the amount of curing agent used varies according to the type, the curing agents are used in an amount of usually 0.05 to 10 parts by weight per 100 parts by weight of the polysilsesquioxane compound.

A curing catalyst may also be used together with the curing agent. As the curing catalyst which is used for curing the polysilsesquioxane compound having a reactive cyclic ether as a functional group, an imidazole compound, an organic phosphorous compound, a tertiary amine, a salt of these compounds, and the like can be given.

As examples of the imidazole compounds, 2-methylimidazole, 2-ethylimidazole, 4-methylimidazole, 4-ethylimidazole, 2-phenylimidazole, 2-phenyl-4-methylimidazole, 2-phenyl-4-hydroxymethylimidazole, 2-ethyl-4-methylimidazole, 1-cyanoethyl-2-methylimidazole, 2-phenyl-4-methyl-5-hydroxymethylimidazole, and 2-phenyl-4,5-dihydroxymethylimidazole can be given.

Examples of the phosphorus compounds include organophosphines and derivatives thereof such as triorganophosphine compounds, for example, triphenylphosphine, tributylphosphine, tri(p-methylphenyl)phosphine, tri(nonylphenyl)phosphine, tri(p-tolyl)phosphine, tri(p-methoxyphenyl)phosphine, tri(p-ethoxyphenyl)phosphine, and triphenylphosphinetriphenylborane; tetraphosphonium salts such as tetra-phenylphosphonium tetraphenylborate; and the like.

As examples of the tertiary amines, triethylamine, dimethylethanolamine, dimethylbenzylamine, 2,4,6-tris(dimethylamino)phenol, 1,8-diazabicyclo[5,4,0]undecene can be given. These compounds may be used either individually or in combination of two or more.

The curing catalyst is used in an amount of usually 0.001 to 5 parts by weight per 100 parts by weight of the polysilsesquioxane compound.

The sealing material for optical elements of the present invention may be produced by adding one or more components mentioned above and mixing with the polysilsesquioxane compound (A).

The sealing material for optical elements can provide a cured product excelling in transparency, crack resistance, and heat resistance. The cured product is free from deterioration which results in cracking or coloration impairing transparency when exposed to higher energy or a high temperature, even when the sealed optical element emits luminescence with a short wavelength and high brightness.

Superior crack resistance of the cured products of the sealing material for optical elements of the present invention can be confirmed by, for example, occurrence of no cracking when the cured products of the sealing material for optical elements cured by a method mentioned later is placed under conditions of high temperature for a long period of time (for example, 100 hours at 150° C.).

Superior heat resistance of the cured products of the sealing material for optical elements of the present invention can be confirmed by, for example, occurrence of almost no decrease in transparency when the cured products of the sealing material for optical elements cured by the method mentioned later is placed under conditions of high temperature for a long period of time (for example, 100 hours at 150° C.).

2) Sealed Optical Element

The sealed optical element of the present invention comprises an optical element sealed with the cured product of the sealing material of the present invention.

As examples of the optical elements, light emitting devices such as an LED and an LD, a light-receiving element, a composite optical element, an optical integrated circuit, and the like can be given.

The sealed optical element of the present invention can be obtained by molding the sealing material for optical elements of the present invention into a desired form, enclosing an optical element therein, and curing the formed sealing material, for example.

Various methods may be used as the means for molding the sealing material for optical elements of the present invention into a desired form. For example, a common method such as a general transfer molding method, a casting method, and the like can be used.

As a method for curing the formed product in which the optical element has been enclosed, a method of heating the cured product, a method of adding the above-mentioned curing agent to the sealing material and curing the molded product, a combination of these methods, and the like can be given. The method of heating is preferable. Since a polysilsesquioxane compound obtained by condensation of a silane compound in the presence of a phosphoric acid catalyst is used in the present invention, a cured product can be obtained in high yield only by heating without using a curing agent.

When curing with heating is used, although the heating temperature differs according to the type of the sealing material for optical elements used, the temperature is usually in a range of 100 to 200° C. The heating time is usually from 10 minutes to 20 hours, and preferably from 30 minutes to 10 hours.

One embodiment of the sealed optical element of the present invention is shown in FIG. 1. FIG. 1(A) shows a lamp-shaped LED sealing object (10A) in which an optical element (LED chip) (4a) is sealed with a cured product (1) of the sealing material for optical elements of the present invention which is molded into a lamp shape.

FIG. 1(B) shows an SMD (Surface Mount Device)-type LED sealing object (10B) comprising a rectangular parallelepiped casing (3) having an LED chip (4b) mounted on the bottom thereof, an opening on top, and a cured product (1) of the sealing material for optical elements of the present invention filled therein. In FIG. 1(B), 5 represents wiring of the LED chip.

The sealed optical element shown in FIG. 1 can be prepared as follows.

The lamp-shaped LED sealing object (10A) is prepared by using a mold (2) having a lamp-shaped recess shown in FIG. 2(a) and FIG. 2(b). FIG. 2(a) shows a cross-sectional view of the mold (2) in the X-Y direction, and FIG. 2(b) shows a top view of the mold (2).

As shown in FIG. 3(a), the sealing material for optical elements (1a) of the present invention is injected into the mold (2) using a sealing material injector (6). For simplicity, only a nozzle of the sealing material injector (6) is shown in FIG. 3(a).

First, a LED chip (4a) is inserted in an appropriate position as shown in FIG. 3(b). Then, the entire object is heated to a prescribed temperature to cure the sealing material for optical elements and integrate the LED chip (4a) with the sealing material as shown in FIG. 3(c). The lamp-shaped LED sealing object (10A) can be obtained by removing the integrated object from the mold (2) as shown in FIG. 3(d).

An SMD-type LED sealing object (10B) can be prepared by using a rectangular parallelepiped casing (3) having an LED chip (4b) mounted on the bottom and an opening on the top as shown in FIG. 4(a) and FIG. 4(b). FIG. 4(a) shows a cross-sectional view of the rectangular parallelepiped casing (3) in the X'-Y' direction, and FIG. 4(b) shows a top view of the mold (3).

As shown in FIG. 5(a), the sealing material for optical elements (1a) of the present invention is injected into the rectangular parallelepiped casing (3) using a sealing material injector (6). For simplicity, only a nozzle of the sealing material injector (6) is shown in FIG. 5(a).

The SMD-type LED sealing object (10B) shown in FIG. 5(b) can be prepared by heating the entire object to a prescribed temperature and curing the sealing material for optical elements (1a).

Because of use of the sealing material for optical elements of the present invention, the sealed optical element of the present invention is free from deterioration of color by heat and light and has superior durability without producing cracks, even if the optical element has a short peak wavelength of luminescence in a range of 350 to 490 nm, such as a white or blue light-emitting LED and the like.

EXAMPLES

The present invention is further described below by way of examples and comparative examples. Note that the present invention is not limited to the following examples.

Example 1

A 200 ml eggplant-shaped flask equipped with a stirrer was charged with 3.97 g (20 mmol) of phenyltrimethoxysilane (manufactured by Tokyo Kasei Kogyo Co., Ltd.), 4.73 g (20 mmol) of 3-glycidoxypropyltrimethoxysilane (manufactured by Tokyo Kasei Kogyo Co., Ltd.), 20 ml of toluene, and 10 ml of distilled water. Then, 0.10 g (1 mmol) of phosphoric acid (manufactured by Kanto Chemical Co., Inc.) was added while stirring the mixture, followed by stirring at room temperature for 16 hours. After the reaction was complete, a saturated aqueous solution of sodium hydrogencarbonate was added to neutralize the reaction mixture. The mixture was allowed to stand for a short time, toluene and water was removed, and the residue was washed twice with distilled water. The resulting residue is dissolved in 100 ml of 2-butanone and dried with anhydrous magnesium sulfate. After separating the anhydrous magnesium sulfate by filtration, the filtrate was added dropwise to a large quantity of n-hexane to reprecipitate the resulting resin. After removing the n-hexane, the precipitate was dissolved in tetrahydrofuran (THF) to recover the resulting resin. After evaporating the THF by means of an evaporator, the residue was dried under vacuum to obtain a polysilsesquioxane compound. The resulting compound was used as a sealing material for optical elements as is without additives.

Example 2

A polysilsesquioxane compound and a sealing material for optical elements were obtained in the same manner as in Example 1 except for using 0.18 g (1 mmol) of phenylphosphoric acid (manufactured by Tokyo Kasei Kogyo Co., Ltd.) as a catalyst instead of the phosphoric acid.

Example 3

A polysilsesquioxane compound and a sealing material for optical elements were obtained in the same manner as in Example 1 except for using 0.25 g (1 mmol) of diphenylphosphate (manufactured by Tokyo Kasei Kogyo Co., Ltd.) as a catalyst instead of the phosphoric acid.

Example 4

A polysilsesquioxane compound and a sealing material for optical elements were obtained in the same manner as in Example 1 except for using 0.09 g (0.5 mmol) of methylenediphosphone acid (manufactured by Tokyo Kasei Kogyo Co., Ltd.) as a catalyst instead of the phosphoric acid.

Example 5

A polysilsesquioxane compound and a sealing material for optical elements were obtained in the same manner as in Example 1 except for using 5.95 g (30 mmol) of phenyltrimethoxysilane and 2.36 g (10 mmol) of 3-glycidoxypropyltrimethoxysilane.

Example 6

A reaction was carried out in the same manner as in Example 1 except for using 5.95 g (30 mmol) of phenyltrimethoxysilane and 2.48 g (10 mmol) of 3-methacryloyloxypropyltrimethoxysilane (manufactured by Tokyo Kasei Kogyo Co., Ltd.) instead of 3.97 g (20 mmol) of phenyltrimethoxysilane and 4.73 g (20 mmol) of 3-glycidoxypropyltrimethoxysilane. After the reaction, a saturated aqueous solution of sodium hydrogencarbonate was added to neutralize the reacted solution, and the toluene layer was separated. The organic layer was dried with anhydrous magnesium sulfate and the magnesium sulfate was separated by filtration. The filtrate was added dropwise to a large quantity of n-hexane to reprecipitate the resulting resin. After removing the n-hexane, the precipitate was dissolved in THF to recover the resulting resin. After evaporating the THF using an evaporator, the residue was dried under vacuum to obtain a polysilsesquioxane compound and a sealing material for optical elements.

Example 7

A reaction was carried out in the same manner as in Example 1 except for using 5.95 g (30 mmol) of phenyltrimethoxysilane and 1.96 g (10 mmol) of 3-mercaptopropyltrimethoxysilane (manufactured by Tokyo Kasei Kogyo Co., Ltd.) instead of 3.97 g (20 mmol) of phenyltrimethoxysilane and 4.73 g (20 mmol) of 3-glycidoxypropyltrimethoxysilane. After the reaction, a saturated aqueous solution of sodium hydrogencarbonate was added to neutralize the reacted solution, and the toluene layer was separated. The organic layer was dried with anhydrous magnesium sulfate and the magnesium sulfate was separated by filtration. The filtrate was added dropwise to a large quantity of n-hexane to reprecipitate the resulting resin. After removing the n-hexane, the precipitate was dissolved in THF to recover the resulting resin. After evaporating the THF using an evaporator, the residue was dried under vacuum to obtain a polysilsesquioxane compound and a sealing material for optical elements.

Example 8

A sealing material for optical elements was obtained by sufficiently mixing 3 g of the polysilsesquioxane compound (1) obtained in Example 1 and 0.03 g of pentaerythritoltetrakis[3-(3',5'-di-tert-butyl-4'-hydroxyphenyl)propionate] (also know as tetrakis[methylene-3-(3',5'-di-t-butyl-4'-hydroxyphenyl)propionate]methane, manufactured by Tokyo Kasei Kogyo Co., Ltd.) as an antioxidant in a 20 ml glass tube.

Comparative Example 1

A polysilsesquioxane compound was obtained in the same manner as in Example 1 except for using 0.10 g (1 mmol) of methansulfonic acid (manufactured by Tokyo Kasei Kogyo Co., Ltd.) as a catalyst instead of the phosphoric acid. The resulting compound was used as a sealing material for optical elements as is without additives.

Comparative Example 2

A polysilsesquioxane compound and a sealing material for optical elements were obtained in the same manner as in Example 1 except for using 0.06 g (1 mmol) of nitric acid (manufactured by Kanto Chemical Co., Inc.) as a catalyst instead of the phosphoric acid.

Comparative Example 3

A polysilsesquioxane compound and a sealing material for optical elements were obtained in the same manner as in Example 1 except for using 0.10 g (1 mmol, as hydrogen chloride) of hydrochloric acid (manufactured by Kanto Chemical Co., Inc.) as a catalyst instead of the phosphoric acid.

Comparative Example 4

A polysilsesquioxane compound and a sealing material for optical elements were obtained in the same manner as in Example 1 except for using 0.10 g (1 mmol) of triethylamine (manufactured by Kanto Chemical Co., Inc.) as a catalyst instead of the phosphoric acid.

Comparative Example 5

Preparation of a polysilsesquioxane compound was carried out in the same manner as in Example 1 except for using 0.91 g (1 mmol, as tetramethylammonium hydroxide) of a 10 wt % aqueous solution of tetramethylammonium hydroxide (manufactured by Aldrich) as a catalyst instead of the phosphoric acid, but the mixture gelled, failing to produce the target compound.

Comparative Example 6

A sealing material for optical elements made of an epoxy resin composition was obtained by sufficiently mixing 2 g of 3,4-epoxycyclohexylmethyl 3,4-epoxycyclohexanecarboxylate (manufactured by Aldrich), 1 g of 2,2-bis(4-glycidyloxyphenyl)propane (manufactured by Tokyo Kasei Kogyo Co., Ltd.), 3 g of 4-methylcyclohexane-1,2-dicarboxylic anhydride (manufactured by Tokyo Kasei Kogyo Co., Ltd.), and 0.03 g of triphenylphosphine (manufactured by Kanto Chemical Co., Inc.) in a 20 ml glass tube.

The molecular weights of the polysilsesquioxane compounds obtained in Examples 1 to 7 and Comparative Examples 1 to 4 were measured by the following methods.

The results are shown in Table 1.

(Measurement of Weight Average Molecular Weight)

The weight average molecular weight (Mw) was determined as a polystyrene-reduced value by gel permeation chromatography (GPC) using tetrahydrofuran (THF) as a solvent.

The measurement was carried out using a GPC measurement device ("HLC-8220 GPC", manufactured by Tosoh Corporation) under the following conditions.
Column: TSKgel GMHXL→TSKgel GMHXL→TSKgel 2000 HXL
Solvent: THF
Temperature: 40° C.
Flow rate: 1 ml/min
Detector: differential refractometer The crack resistance of the polysilsesquioxane compounds, obtained in Examples 1 to 7 and Comparative Examples 1 to5, and the resin compositions obtained in Example 8 and Comparative Example 6 were evaluated as follows.

(Evaluation of Crack Resistance)

Test specimens (length: 25 mm, width: 20 mm, thickness: 1 mm) of the polysilsesquioxane compounds, obtained in Examples 1 to 7 and Comparative Examples 1 to 5, and the resin compositions obtained in Example 8 and Comparative Example 6 were made by pouring the compounds or compositions into a mold and curing at 125° C. for 6 hours. The resulting test specimens were heated in an oven at 150° C. for 24 hours and evaluated as "Good" if there were no cracks and as "Bad" if there was a crack, by visual examination. The results are shown in Table 1.

The initial transparency and transparency after the heat test of the polysilsesquioxane compounds obtained in Examples 1 to 7 and Comparative Examples 1 to 5 and the resin compositions obtained in Example 8 and Comparative Example 6 were measured as follows.

(Measurement of Initial Transparency)

Test specimens (length: 25 mm, width: 20 mm, thickness: 1 mm) of the polysilsesquioxane compounds, obtained in Examples 1 to 7 and Comparative Examples 1 to 5, and the resin compositions obtained in Example 8 and Comparative Example 6 were made by pouring the compounds or compositions into a mold and curing at 125° C. for 6 hours. The initial transparency of the resulting specimens at 400 nm, 450 nm, and 500 nm was measured by a spectrophotometer ("MPC-3100" manufactured by Shimadzu Corporation).

(Measurement of Transparency After Heat Test)

After measuring the initial transparency, the specimens were heated in an oven at 150° C. for 100 hours. The transparency after heating at 400 nm, 450 nm, and 500 nm was measured. The results are shown in Table 1.

As shown in Table 1, a cured product (sealing material) with excellent transparency, crack resistance, and heat resistance can be produced by using the sealing materials for optical elements obtained in Examples 1 to 7.

On the other hand, the sealing materials for optical elements obtained in Comparative Examples 1 and 2 exhibited excellent crack resistance, but were inferior in heat resistance as demonstrated by the remarkably decreased transparency after the heat test.

The sealing material for optical elements obtained in Comparative Example 3 showed inferior crack resistance and heat resistance.

The polysilsesquioxane compound obtained in Comparative Example 4 had a high weight-average molecular weight of 8,800 and was unable to produce a formed product.

The target product was not obtained when the compound obtained in Comparative Example 5 was used due to gelation of the reaction mixture.

The sealing material for optical elements obtained in Comparative Example 6 had low transparency especially at 400 nm. Also, the transparency after the heat test decreased substantially.

Figure 1:
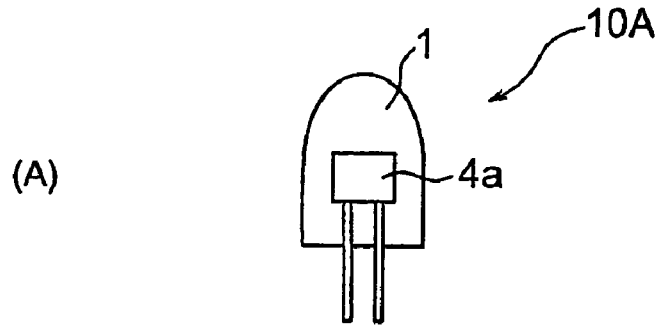
FIG. 1(a) and FIG. 1(b) are views showing an example of a sealed optical element according to the present invention.
Figure 1:
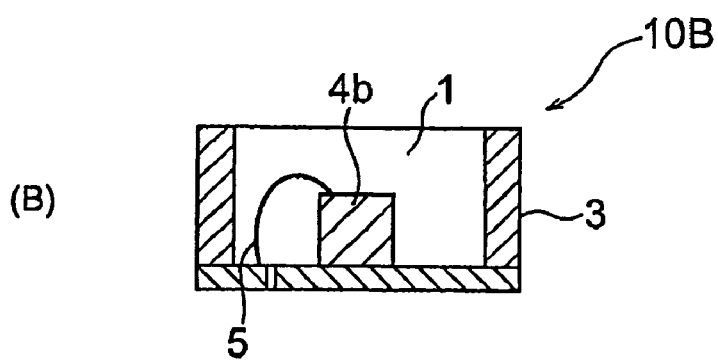
Figure 2:
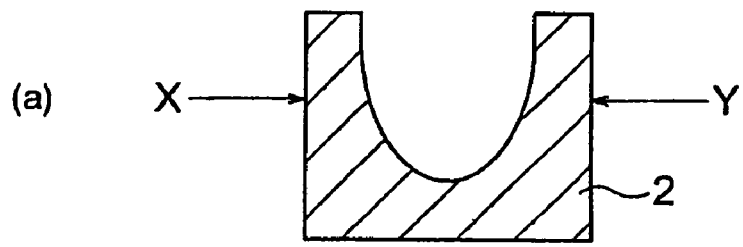
FIG. 2(a) and FIG. 2(b) are schematic views of a mold used for fabricating a Lamp-type sealed LED.
Figure 2:
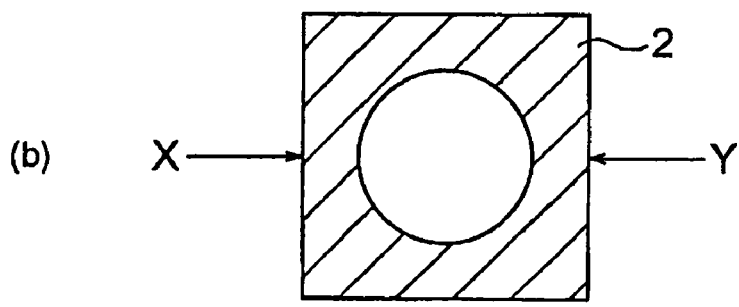
Figure 3:
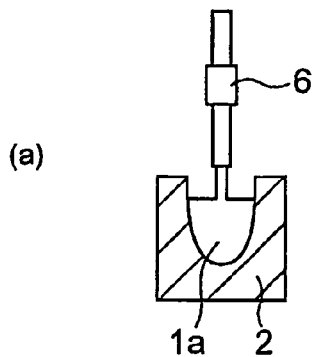
FIG. 3(a), FIG. 3(b), FIG. 3(c) and FIG. 3(d) are sectional views showing a process of fabricating a Lamp-type sealed LED.
Figure 3:
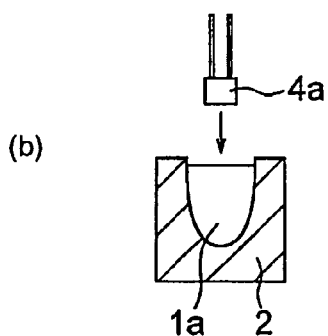
Figure 3:
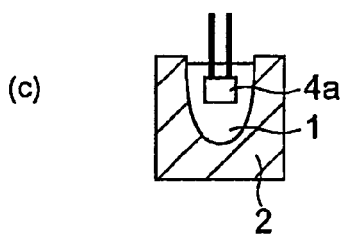
Figure 3:
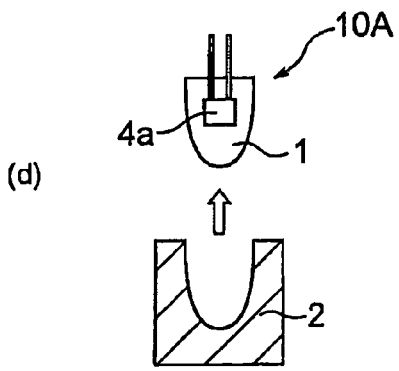
Figure 4:
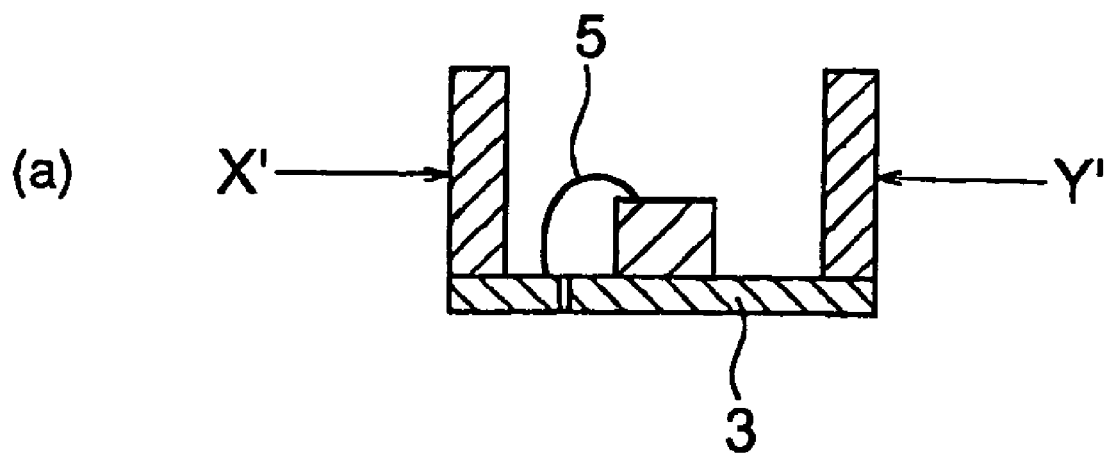
FIG. 4(a) and FIG. 4(b) are schematic views of a rectangular case used for fabricating an SMD-type sealed LED.
Figure 4:
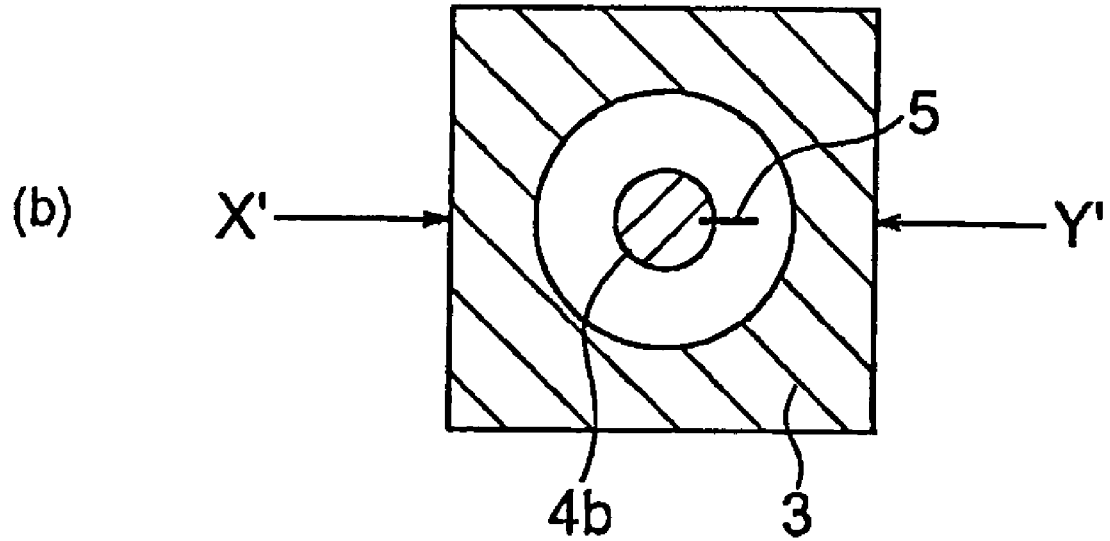
Figure 5:
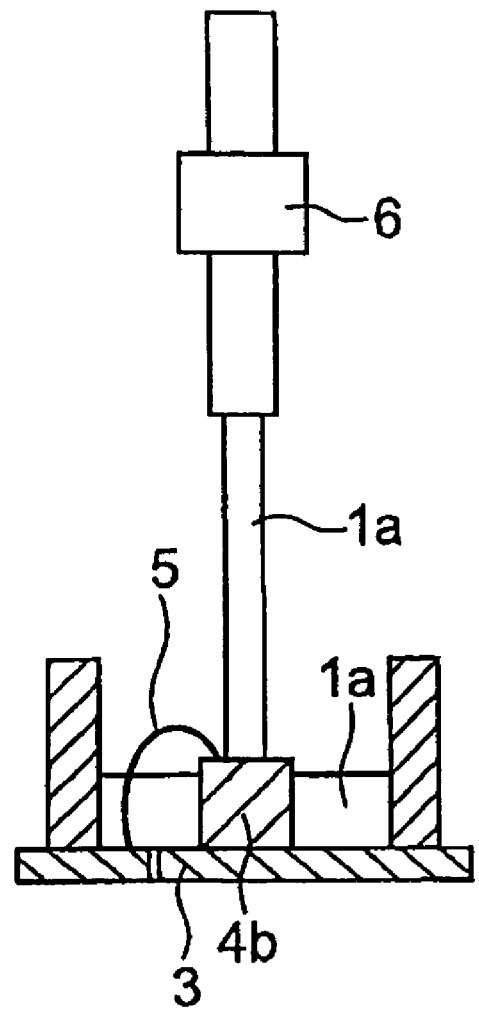
FIG. 5(a) and FIG. 5(b) are sectional views showing a process of fabricating an SMD-type sealed LED.
Figure 5:
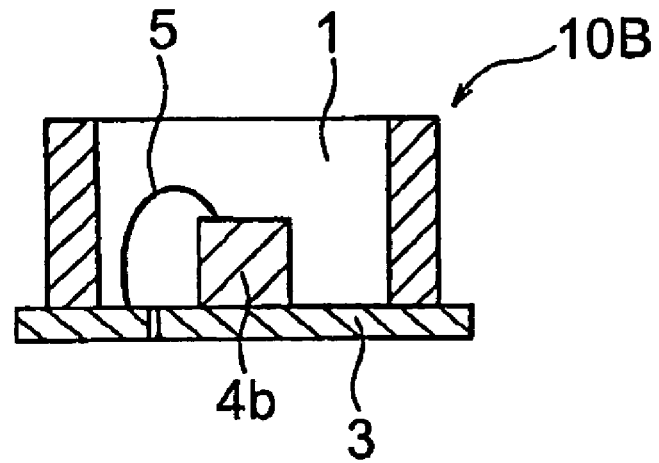

What is claimed is:

1. A sealing material for optical elements, comprising:
a polysilsesquioxane compound with a ladder structure, which contains a repeating unit of the following formula (A) in the molecule as a major component,

TABLE 1

| | | Weight average molecular weight (Mw) | Crack resistance | Transparency (%) | | | | | |
|---|---|---|---|---|---|---|---|---|---|
| | | | | Initial transparency (%) | | | Transparency after heating (%) | | |
| | | | | 400 nm | 450 nm | 500 nm | 400 nm | 450 nm | 500 nm |
| Example | 1 | 2,200 | Good | 89 | 90 | 91 | 82 | 86 | 89 |
| | 2 | 2,700 | Good | 89 | 90 | 90 | 77 | 79 | 87 |
| | 3 | 2,400 | Good | 88 | 90 | 91 | 75 | 75 | 87 |
| | 4 | 2,200 | Good | 89 | 90 | 92 | 74 | 78 | 88 |
| | 5 | 2,000 | Good | 89 | 90 | 92 | 82 | 83 | 88 |
| | 6 | 3,200 | Good | 88 | 90 | 90 | 72 | 80 | 87 |
| | 7 | 4,300 | Good | 89 | 91 | 91 | 65 | 74 | 82 |
| | 8 | — | Good | 87 | 90 | 91 | 84 | 87 | 90 |
| Comparative Example | 1 | 2,200 | Good | 89 | 90 | 91 | 15 | 40 | 63 |
| | 2 | 2,200 | Good | 89 | 89 | 90 | 0.5 | 6 | 26 |
| | 3 | 3,200 | Bad | 89 | 90 | 91 | Cracks in specimen | | |
| | 4 | 8,800 | | Unable to form | | | | | |
| | 5 | Gelled | — | — | — | — | — | — | — |
| | 6 | — | Good | 48 | 82 | 89 | 23 | 62 | 84 |

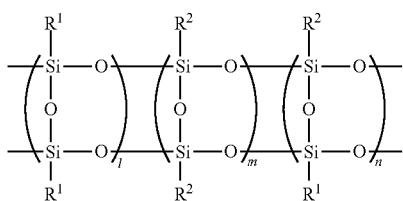
(A)

wherein $R^1$ represents a group having a reactive functional group, $R^2$ represents an alkyl group having 1 to 20 carbon atoms or a phenyl group which may have a substituent, and l, m, and n individually represent 0 or an arbitrary integer, provided that l and n are not 0 at the same time, the polysilsesquioxane compound being obtained by condensing a silane compound (1) shown by the formula (1), $R^1Si(OR^3)_p(X^1)_{3-p}$, wherein $R^1$ has the same meaning as above, $R^3$ represents an alkyl group having 1 to 6 carbon atoms, $X^1$ represents a halogen atom, and p is an integer from 0 to 3, and a silane compound (2) shown by the formula (2), $R^2Si(OR^4)_q(X^2)^{3-q}$, wherein $R^2$ has the same meaning as above, $R^4$ represents an alkyl group having 1 to 6 carbon atoms, $X^2$ represents a halogen atom, and q is an integer from 0 to 3, at a molar ratio of 5:95 to 100:0 in the presence of a phosphoric acid catalyst, wherein a cured product of the sealing material that has been heated at 150° C. for 100 hours has a transparency to light having a wavelength of 400 nm of 73% or more than that of a cured product before being heated at 150° C. for 100 hours;

wherein the phosphoric acid catalyst is a compound shown by the following formula (3) or the following formula (4),

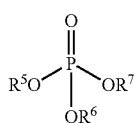
(3)

wherein $R^5$, $R^6$, and $R^7$ individually represent a hydrogen atom, an alkyl group having 1 to 8 carbon atoms, or a phenyl group which may have a substituent, provided that at least one of $R^5$, $R^6$, and $R^7$ is a hydrogen atom and provided that at least one of $R^5$, $R^6$, and $R^7$ is not a hydrogen atom,

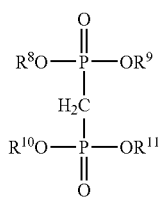
(4)

wherein $R^8$, $R^9$, $R^{10}$, and $R^{11}$ individually represent a hydrogen atom, an alkyl group having 1 to 8 carbon atoms, or a phenyl group which may have a substituent, provided that at least one of $R^8$, $R^9$, $R^{10}$, and $R^{11}$ is a hydrogen atom.

2. The sealing material for optical elements according to claim 1, wherein $R^1$ in the formula (A) representing the polysilsesquioxane compound is a group having a reactive cyclic ether group, an alkenyl group, a methacryloyl group, an acryloyl group, or a mercapto group.

3. The sealing material for optical elements according to claim 1, wherein the polysilsesquioxane compound is a compound having a weight average molecular weight of 1,000 to 5,000.

4. A method for producing a sealing material for optical elements comprising a polysilsesquioxane compound with a ladder structure, which contains a repeating unit of the following formula (A) in the molecule as a major component,

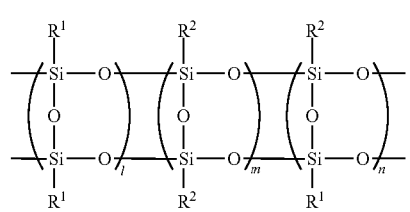
(A)

wherein $R^1$ represents a group having a reactive functional group, $R^2$ represents an alkyl group having 1 to 20 carbon atoms or a phenyl group which may have a substituent, and l, m, and n individually represent 0 or an arbitrary integer, provided that l and n are not 0 at the same time, the method comprising:

obtaining the polysilsesquioxane compound by condensing a silane compound (1) shown by the formula (1), $R^1Si(OR^3)_p(X^1)_{3-p}$, wherein $R^1$ has the same meaning as above, $R^3$ represents an alkyl group having 1 to 6 carbon atoms, $X^1$ indicates a halogen atom, and p is an integer from 0 to 3, and a silane compound (2) shown by the formula (2), $R^2Si(OR^4)_q(X^2)_{3-q}$, wherein $R^2$ has the same meaning as above, $R^4$ represents an alkyl group having 1 to 6 carbon atoms, $X^2$ indicates a halogen atom, and q is an integer from 0 to 3, at a molar ratio of 5:95 to 100:0 in the presence of a phosphoric acid catalyst;

wherein the phosphoric acid catalyst is a compound shown by the following formula (3) or the following formula (4),

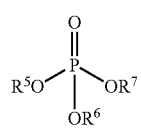
(3)

wherein $R^5$, $R^6$, and $R^7$ individually represent a hydrogen atom, an alkyl group having 1 to 8 carbon atoms, or a phenyl group which may have a substituent, provided that at least one of $R^5$, $R^6$, and $R^7$ is a hydrogen atom and provided that at least one of $R^5$, $R^6$, and $R^7$ is not a hydrogen atom, (3) 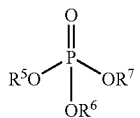

(4) 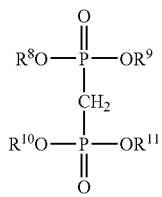

wherein $R^8$, $R^9$, $R^{10}$, and $R^{11}$ individually represent a hydrogen atom, an alkyl group having 1 to 8 carbon atoms, or a phenyl group which may have a substituent, provided that at least one of $R^8$, $R^9$, $R^{10}$, and $R^{11}$ is a hydrogen atom.

5. A cured product obtained by heating the sealing material for optical elements according to any one of claims 1, 2, or 3 at 100 to 200° C. for 10 minutes to 20 hours without adding a curing agent.

6. A sealed optical element in which an optical element is sealed with a cured product of the sealing material according to any one of claims 1, 2, or 3.

* * * * *